US012695269B2

(12) United States Patent
Zhou et al.

(10) Patent No.: US 12,695,269 B2
(45) Date of Patent: Jul. 28, 2026

(54) LASER DEVICE

(71) Applicant: Hisense Laser Display Co., Ltd, Qingdao City (CN)

(72) Inventors: Zinan Zhou, Qingdao City (CN); Youliang Tian, Qingdao City (CN); Guangchao Du, Qingdao City (CN); Jihong Han, Qingdao City (CN)

(73) Assignee: HISENSE LASER DISPLAY CO., LTD, Qingdao City (CN)

( * ) Notice: Subject to any disclaimer, the term of this patent is extended or adjusted under 35 U.S.C. 154(b) by 1114 days.

(21) Appl. No.: 17/698,419

(22) Filed: Mar. 18, 2022

(65) Prior Publication Data

US 2022/0209499 A1 Jun. 30, 2022

Related U.S. Application Data

(63) Continuation of application No. PCT/CN2020/121632, filed on Oct. 16, 2020.

(30) Foreign Application Priority Data

Sep. 20, 2019 (CN) .......................... 201910892998.3

(51) Int. Cl.
*H01S 5/024* (2006.01)
*H01S 3/04* (2006.01)
(Continued)

(52) U.S. Cl.
CPC ........ *H01S 5/02469* (2013.01); *H01S 3/0405* (2013.01); *H01S 5/02255* (2021.01);
(Continued)

(58) Field of Classification Search
CPC ............... H01S 5/02469; H01S 3/0405; H01S 5/02255; H01S 5/0237; H01S 5/02476; H01S 5/4025; H01S 5/4031
See application file for complete search history.

(56) References Cited

U.S. PATENT DOCUMENTS 6,326,646 B1 * 12/2001 Baillargeon ........ H01S 5/02375
257/94
6,796,480 B1 * 9/2004 Powers ................ B23K 1/0016
228/103
(Continued)

FOREIGN PATENT DOCUMENTS

CN          2306597 Y          2/1999
CN          102401949 A          4/2012
(Continued)

OTHER PUBLICATIONS

International Search Report and Written Opinion issued in corresponding International Application No. PCT/CN2020/121632 dated Jan. 15, 2021, with English translation.
(Continued)

*Primary Examiner* — Yuanda Zhang
(74) *Attorney, Agent, or Firm* — Morgan, Lewis & Bockius LLP

(57) ABSTRACT

A laser device includes a case, at least one heat sink, a plurality of laser chips, and at least one prism. The at least one heat sink, the plurality of laser chips, and the at least one prism are all located in the case. Each heat sink and each prism corresponds to one or more laser chips. The laser chip is located on a side of a corresponding heat sink away from the case, and the prism is located on a light-emitting side of one or more corresponding laser chips. The prism is configured to reflect a beam of light emitted by the one or more corresponding laser chips. The heat sink includes a heat dissipation substrate, a heat dissipation layer, an auxiliary layer, and a conductive layer that are disposed in sequence along a direction away from the case.

17 Claims, 4 Drawing Sheets

(51) Int. Cl.
　　*H01S 5/02255*　　(2021.01)
　　*H01S 5/0237*　　(2021.01)
　　*H01S 5/40*　　(2006.01)
(52) U.S. Cl.
　　CPC ........ *H01S 5/0237* (2021.01); *H01S 5/02476*
　　　　(2013.01); *H01S 5/4025* (2013.01); *H01S*
　　　　　　　　　　*5/4031* (2013.01)

(56) References Cited

U.S. PATENT DOCUMENTS

| | | | |
|---|---|---|---|
| 7,003,006 | B2 | 2/2006 | You et al. |
| 2004/0027631 | A1* | 2/2004 | Nagano ................ G02B 6/4249 |
| | | | 372/36 |
| 2004/0201029 | A1* | 10/2004 | Yamane ................ H01S 5/0237 |
| | | | 257/99 |
| 2013/0272329 | A1* | 10/2013 | Auen .................. H01S 5/02216 |
| | | | 372/34 |
| 2016/0064896 | A1 | 3/2016 | Gao |
| 2017/0317467 | A1* | 11/2017 | Miura .................. H01S 5/4031 |

FOREIGN PATENT DOCUMENTS

| | | | |
|---|---|---|---|
| CN | 202759153 | U | 2/2013 |
| CN | 103887703 | A | 6/2014 |
| CN | 104051954 | A | 9/2014 |
| CN | 104201557 | A | 12/2014 |
| CN | 106019496 | A | 10/2016 |
| CN | 106451057 | A | 2/2017 |
| CN | 106848839 | A | 6/2017 |
| CN | 207250929 | U | 4/2018 |
| CN | 207338899 | U | 5/2018 |
| CN | 109560455 | A | 4/2019 |
| CN | 109725392 | A | 5/2019 |

OTHER PUBLICATIONS

Office Action issued in corresponding Chinese Patent Application No. 201910892998.3 dated Nov. 1, 2021, with English translation.

\* cited by examiner

20

20

LASER DEVICE

CROSS-REFERENCE TO RELATED APPLICATIONS

This application is a Continuation Application of International Patent Application No. PCT/CN2020/121632 filed on Oct. 16, 2020, which claims priority to Chinese Patent Application No. 201910892998.3, filed on Sep. 20, 2019. Both applications are incorporated herein by reference in their entireties.

TECHNICAL FIELD

The present disclosure relates to the field of photoelectric technologies, and in particular, to a laser device.

BACKGROUND

With the development of photoelectric technologies, laser devices also enjoyed rapid development. Laser devices are being used in more and more fields due to the purity and spectral stability of the light they emit. For example, laser devices may be used in the soldering process, cutting process, and laser projection.

SUMMARY

A laser device includes a case, at least one heat sink, a plurality of laser chips, and at least one prism. The at least one heat sink is located in the case. Each heat sink includes a heat dissipation substrate, a heat dissipation layer, an auxiliary layer and a conductive layer that are disposed in sequence along a direction away from the case. The plurality of laser chips are located on a side of the at least one heat sink away from the case, and each heat sink corresponds to one or more laser chips. The at least one prism is located in the case. The at least one heat sink corresponds to the at least one prism. Each prism corresponds to one or more laser chips, each prism is located on a light-emitting side of corresponding one or more laser chips, and each prism is configured to reflect a beam of light emitted by the corresponding one or more laser chips.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figures 1, 2:
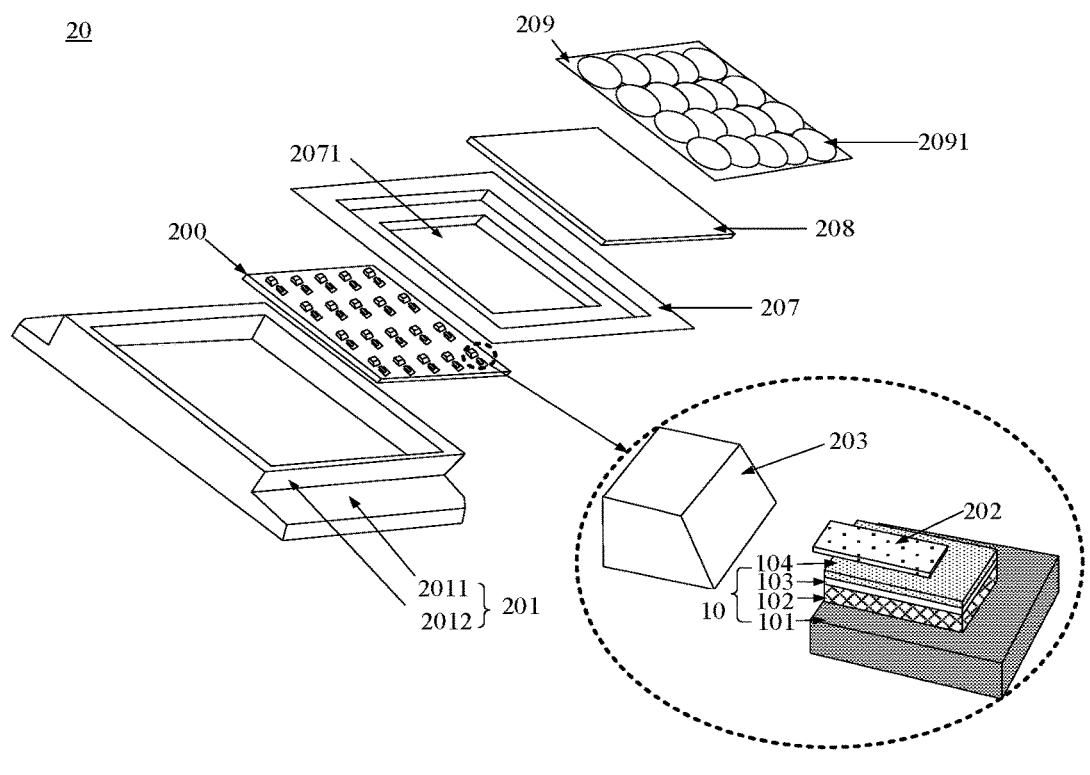
FIG. 1 is an exploded diagram of a laser device, in accordance with some embodiments.
FIG. 2 is a cross-sectional diagram of a laser device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description, the terms such as "one embodiment", "some embodiments", "exemplary embodiments", "example", "specific example" or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

In describing some embodiments, the terms "coupled", "connected" and derivatives thereof may be used. For example, the term "connected" may be used when describing some embodiments to indicate that two or more components are in direct physical or electrical contact with each other. For another example, the term "coupled" may be used when describing some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "applicable to" or "configured to" used herein has an open and inclusive meaning, which does not exclude devices that are applicable to or configured to perform additional tasks or steps.

In addition, the phrase "based on" used herein has an open and inclusive meaning, since a process, step, calculation or other action that is "based on" one or more of the stated conditions or values may, in practice, be based on additional conditions or values exceeding those stated.

As used herein, depending on the context, the term "if" is optionally construed as "when" or "in a case where" or "in response to determining" or "in response to detecting". Similarly, depending on the context, the phrase "if it is determined . . . " or "if [a stated condition or event] is detected" is optionally construed as "in a case where it is determined . . . " or "in response to determining . . . " or "in a case where [the stated condition or event] is detected" or "in response to detecting [the stated condition or event]".

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

Hereinafter, the terms "first" and "second" are only used for descriptive purposes, and cannot be construed as indicating or implying the relative importance or implicitly indicating the number of indicated technical features. Therefore, a feature defined with "first" or "second" may explicitly or implicitly include one or more of the features. In the description of the embodiments of the present disclosure, the term "a plurality of/the plurality of" means two or more unless otherwise specified.

Some embodiments of the present disclosure provide a laser device 20. FIG. 1 is an exploded diagram of a laser device, in accordance with some embodiments. As shown in FIG. 1, the laser device 20 includes a case 201, a support substrate 200, at least one heat sink 10, a plurality of laser chips 202, at least one prism 203, a frame 207, a cover plate 208 and a collimating lens assembly 209. The support substrate 200 is located inside the case 201. The at least one heat sink 10, the plurality of laser chips 202 and the at least one prism 203 are all located on a side of the support substrate 200 away from the case 201. The frame 207, the cover plate 208 and the collimating lens assembly 209 are stacked on the support substrate 200 in sequence along a direction away from the case 201.

The case 201 is configured to encapsulate the plurality of laser chips 202. The case 201 includes a base 2011 and an encapsulation portion 2012 disposed on the base 2011. The encapsulation portion 2012 includes a hollow inner chamber.

In some embodiments, the support substrate 200, the at least one heat sink 10, the plurality of laser chips 202 and the at least one prism 203 are all located in the inner chamber of the encapsulation portion 2012. The frame 207 covers the case 201, the cover plate 208 covers the frame 207, and the collimating lens assembly 209 covers the cover plate 208. The frame 207 has an opening 2071. In a case where the frame 207 covers the case 201, the at least one heat sink 10, the plurality of laser chips 202 and the at least one prism 203 are exposed from the opening 2071. After the cover plate 208 is covered on the frame 207, the opening 2071 may be closed, and the inner chamber of the case 201 may be closed. The collimating lens assembly 209 includes a plurality of collimating lenses 2091, and the plurality of collimating lenses 2091 are in one-to-one correspondence with the plurality of laser chips 202.

The collimating lens assembly 209 is configured to adjust a direction of a beam of light emitted by each laser chip 202 and reflected by the corresponding prism 203. The collimating lens assembly 209 may be able to reduce a divergence angle of the light and thus improve a collimation degree of the beam of light.

Components of the laser device 20 are usually assembled by a heating and soldering method. If the thermal expansion coefficients of the components are all different, a separate assembly environment needs to be provided for each component according a suitable heating temperature of each component. Therefore, in order to simplify the process, in some embodiments, it is arranged that one or more of the frame 207, the cover plate 208 and the collimating lens assembly 209 have a same thermal expansion coefficient as the support substrate 200. For example, in a case where the thermal expansion coefficients of the components of the laser device 20 are all the same, the components may be assembled by a same process and at a same temperature, which may speed up the assembly process of the laser device 20.

In the process of heating and soldering the components of the laser device 20 to assemble the components together, if the materials of the components are all different, it is difficult to solder the components together. Therefore, in some embodiments, it is arranged that one or more of the frame 207, the cover plate 208 and the collimating lens assembly 209 are made of a same material as the support substrate 200. For example, in a case where the materials of the components of the laser device 20 are all the same, the components may be more easily soldered into a one-piece structure during the heating and soldering process, which may help improve a firmness of the assembled laser device 20.

In some embodiments, the support substrate 200, the frame 207 and portions, other than the collimating lenses 2091, of the collimating lens assembly 209 are all made of ceramic. Ceramic may include silicon materials, such as silicon dioxide; and may further include aluminum oxide or aluminum nitride. Ceramic has a high transmittance to infrared light. For a laser chip 202 that emits infrared light, the use of ceramic material may enable an even higher intensity of infrared light emitted by the laser device 20. In some embodiments, the cover plate 208 and the collimating lens 2091 are made of glass.

It will be noted that, in some embodiments, the support substrate 200, the frame 207, the cover plate 208 and the collimating lens assembly 209 are optional and can be omitted for the laser device 20.

FIG. 2 is a cross-sectional diagram of a laser device, in accordance with some embodiments. The present disclosure does not limit the number of the laser chips 202. For example, the laser device 20 may include two, three, four or even more laser chips 202. Each heat sink 10 and each prism 203 correspond to one or more laser chips 202. The laser chip 202 is located on a side of a corresponding heat sink 10 away from the case 201. The prism 203 is located on a light-emitting side of corresponding one or more laser chips 202, and the prism 203 is configured to reflect a beam of light emitted by the corresponding one or more laser chips 202.

The heat sink 10 and the prism 203 have two corresponding relations in terms of quantity.

In a first corresponding relation, each prism 203 corresponds to a single heat sink 10; one or more laser chips 202 are provided on each heat sink 10, and each prism 203 corresponds to the one or more laser chips 202 located on a corresponding heat sink 10.

In a second corresponding relation, each prism 203 corresponds to a plurality of heat sinks 10; a single laser chip 202 is provided on each heat sink 10, and each prism 203 corresponds to a plurality of laser chips 202 located on the corresponding plurality of heat sinks 10.

The heat sink is configured to transfer heat generated by the laser chip 202 when the laser chip 202 emits light to other components, so as to rapidly cool the laser chip 202 and prevent accumulated heat from damaging the laser chip 202 and affecting a service life of the laser device 202. The heat sink 10 may also be configured to assist in the heat dissipation of other light emitting devices in addition to the laser chip 202, such as a light emitting diode (LED).

As shown in FIG. 2, in some embodiments, the heat sink 10 includes a heat dissipation substrate 101, a heat dissipation layer 103, an auxiliary layer 103, and a conductive layer 104 that are disposed in sequence along a direction away from the case 201. The laser chip 202 is attached to the conductive layer 104 of a corresponding heat sink 10.

In some embodiments, a material of the heat dissipation substrate 101 includes one or more of aluminum, copper, aluminum nitride and silicon carbide.

A thermal conductivity of the heat dissipation layer 102 is greater than 20 W/(m·° C.).

The thermal conductivity is defined by a formula:

$$k_x = -\frac{q_x''}{\left(\frac{\partial T}{\partial x}\right)}.$$

In this formula, x represents a heat flow direction; $q_x''$ represents a heat flow density in the heat flow direction and is measured by a unit of W/m²;

$$\frac{\partial T}{\partial x}$$

represents a temperature gradient in the heat flow direction, and is measure by a unit of ° C./m. It will be noted that, the temperature gradient in the heat flow direction may also be measured by a unit of K/m. If the Kelvin temperature is adopted, the thermal conductivity is correspondingly measured by a unit of W/(m·K).

Therefore, the larger the thermal conductivity of the heat dissipation layer 102, the better the heat dissipation effect of the heat sink 10. For example, the heat dissipation layer 102 may be made of copper, and a thermal conductivity of copper is 401 W/(m·° C.). The heat dissipation layer 102 may be also made of silver and/or aluminum, whereas a thermal conductivity of silver is 429 W/(m·° C.), and a thermal conductivity of aluminum is 237 W/(m·° C.).

It will be noted that, in some embodiments of the present disclosure, generally, the heat dissipation layer 102 will not be made of titanium. Since the thermal conductivity of titanium is only 20 W/(m·° C.), a heat sink 10 made of titanium may only be able to effectively dissipate the heat of a laser chip 202 with an output power on the order of micro-watts. If the output power of the laser chip 202 is large, the temperature of the heat sink 10 will continue to rise rapidly, and the heat sink 10 will not be able to dissipate the heat of the laser chip 202.

In some embodiments, the thermal conductivity of the heat dissipation layer 102 is greater than 20 W/(m·° C.). The heat may be rapidly conducted in the heat dissipation layer 102. In addition, the heat dissipation layer 102 has a large heat capacity. Thus, the heat sink 10 may effectively dissipate the heat of the laser chip 202 with a large output power, ensure a low actual working temperature of the laser chip 202, and prolong the service life of the laser chip 202.

In some embodiments, a thermal expansion coefficient of the heat dissipation layer 102 is not much different from a thermal expansion coefficient of the heat dissipation substrate 101. For example, an absolute value of a difference between the thermal expansion coefficient of the heat dissipation layer 102 and the thermal expansion coefficient of the heat dissipation substrate 101 is less than or equal to 30×10⁻⁶/° C. With this arrangement, it may be possible to prevent the difference between an expansion amount of the heat dissipation layer 102 and an expansion amount of the heat dissipation substrate 101 from being too large when subjected to heat, and avoid a difference between the forces borne at each point of a contact surface between the heat dissipation layer 102 and the heat dissipation substrate 101 from being too large. As such, it may be possible prevent a gap from appearing between the heat dissipation layer 102 and the heat dissipation substrate 101, or prevent a wrinkle from appearing on the contact surface between the heat dissipation layer 102 and the heat dissipation substrate 101, and thus ensure a firmness of the heat dissipation layer 102 on the heat dissipation substrate 101.

For example, the heat dissipation layer 102 is made of copper, and the thermal expansion coefficient thereof is 16.7×10⁻⁶/° C.; the heat dissipation substrate 101 is made of aluminum nitride, and the thermal expansion coefficient thereof is 4.5×10⁻⁶/° C.

In some other embodiments, the thermal expansion coefficient of the heat dissipation layer 102 is the same as the thermal expansion coefficient of the heat dissipation substrate 101. Therefore, the heat dissipation layer 102 and the heat dissipation substrate 101 have the same expansion amount when subjected to heat, and the force borne at each point of the contact surface between the heat dissipation layer 102 and the heat dissipation substrate 101 is even. Thus, it may be possible to prevent a damage to an internal structure of the heat dissipation layer 102 or the heat dissipation substrate 101, and improve the firmness of the heat dissipation layer 102 on the heat dissipation substrate 101.

It will be noted that, the thermal conductivity and thermal expansion coefficient of the heat dissipation layer 102 need to be considered when determining a material of the heat dissipation layer 102. In a case where the thermal conductivity of the heat dissipation layer 102 is large with excellent thermal conductivity, a limitation on the thermal expansion coefficient of the heat dissipation layer 102 may be relaxed accordingly. For example, the absolute value of the difference between the thermal expansion coefficient of the heat dissipation layer 102 and the thermal expansion coefficient of the heat dissipation substrate 101 may be set to be greater than 30×10⁻⁶/° C.

In some embodiments, a thickness of the heat dissipation layer 102 is greater than or equal to 1 μm. Further, the thickness of the heat dissipation layer 102 is greater than or equal to 30 μm. For example, the thickness of the heat dissipation layer 102 is 35 μm, 40 μm, 45 μm or 50 μm. Since the heat dissipation layer 102 is thick, the heat generated by the laser chip 202 may be conducted in the heat dissipation layer 102 and travel in the heat dissipation layer 102 for a long time, so that the heat is evenly distributed in the heat dissipation layer 102, and the heat generated by the laser chip 202 is evenly dissipated.

In some embodiments, in order to prevent the heat from travelling in the heat dissipation layer 102 for too long and ensure a high heat dissipation speed, the thickness of the heat dissipation layer 102 may be set to be less than or equal to 75 μm. It will be noted that, the thickness of the heat dissipation layer 102 may also be greater than 75 μm. For example, the thickness of the heat dissipation layer 102 is 80 μm or 85 μm, which is not limited in the embodiments of the present disclosure.

In some embodiments, the material of the conductive layer 104 includes gold. The conductive layer 104 is electrically connected to an electrode (such as a negative electrode or a positive electrode) of the laser chip 202, and the conductive layer 104 may be connected to a power source through a wire, so as to realize a purpose of supplying power to the laser chip 202 from the power source through the conductive layer 104. The conductive layer 104 is also highly resistant to corrosion, so as to protect the laser chip 202 and prevent the electrodes of the laser chip 202 from being oxidized.

In some embodiments, a thickness of the conductive layer 104 is greater than or equal to 0.1 μm. For example, the thickness of the conductive layer 104 is 0.1 μm, 0.2 μm, 0.3 μm or 0.5 μm. With this arrangement, it may be possible to guarantee a good bonding quality between the conductive layer 104 and the auxiliary layer 103, enable the conductive layer 104 to transfer a large current, and thus prevent the conductive layer 104 from being damaged by an excessive current transferred from the power source to the laser chip 202.

In some embodiments, the auxiliary layer 103 is configured to assist adhesion of the heat dissipation layer 102 to the conductive layer 104, thereby ensuring an adhesion reliability between the heat dissipation layer 102 and the conductive layer 104.

A material of the auxiliary layer 103 is different from a material of the heat dissipation layer 102, and is also different from a material of the conductive layer 104.

For example, the auxiliary layer 103 is made of nickel, the heat dissipation layer 102 is made of copper, and the conductive layer 104 is made of gold. In a case where a gold layer is directly formed on a copper layer, an adhesion between the gold layer and the copper layer is poor, while an adhesion between the gold layer and the nickel layer and an adhesion between the nickel layer and the copper layer are both good. Therefore, firstly, a nickel layer is formed on a copper layer, and then a gold layer is formed on the nickel layer, so as to ensure a firmness of the gold layer. The thickness of the auxiliary layer 103 ranges from 1 μm to 2 μm.

Figure 8:
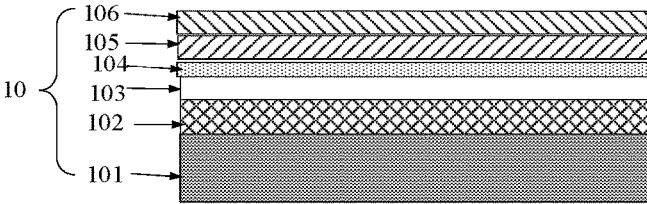
FIG. 8 is a structural diagram of a heat sink, in accordance with some embodiments.

FIG. 8 is a structural diagram of a heat sink, in accordance with some embodiments. As shown in FIG. 8, the heat sink 10 further includes an isolation layer 105 and a solder layer 106 that are disposed in sequence on a side of the conductive layer 104 away from the case 201. The solder layer 106 is configured to solder the laser chip 202 to the heat sink 10 when the solder layer 106 is melted. The isolation layer 105 is configured to isolate the conductive layer 104 from the solder layer 106, so as to prevent the conductive layer 104 from merging with the solder layer 106 at a high temperature, and thus avoid a change in the properties of the solder layer 106 and the conductive layer 104.

In some embodiments, the solder layer 106 is made of gold-tin alloy, in which a proportion of gold ranges from 75% to 80%. The isolation layer 105 is made of platinum. For example, the conductive layer 104 is made of gold. Since the proportion of gold in the gold-tin alloy is related to a soldering effect of the gold-tin alloy, the isolation layer 105 is provided between the conductive layer 104 and the solder layer 106 to prevent the conductive layer 104 from merging with the solder layer 106 at a high temperature, so as to prevent the proportion of gold in the solder layer 106 from changing, and thus ensure the soldering effect of the solder layer 106.

In some embodiments, a thickness of the solder layer 106 ranges from 1 μm to 10 μm.

In some embodiments, a manufacturing process of the heat sink 10 is as follows: firstly, the heat dissipation substrate 101 is manufactured, and then the heat dissipation layer 102 is formed on the heat dissipation substrate 101 by a thin film forming method or a method of directly sintering a copper layer. The thin film forming method is to metallize a surface of the heat dissipation substrate 101 by surface deposition processes such as evaporation and magnetron sputtering, for example, by sputtering titanium and chromium under vacuum conditions, then sputtering copper particles, and finally electroplating the surface of the sputtered copper particles to increase a thickness of the copper layer. For example, the thickness of the sputtered copper particles is less than or equal to 5 μm. The method of directly sintering the copper layer is to sinter a copper foil so that the copper foil is directly formed on the surface of the heat dissipation substrate 101. After the heat dissipation layer 102 is formed, the auxiliary layer 103, the conductive layer 104, the isolation layer 105 and the solder layer 106 are formed on the heat dissipation layer 102 in sequence. After the solder layer 106 is formed, the laser chip 202 may be soldered to the heat sink 10 by a high precision eutectic solder machine.

In some embodiments, as shown in FIG. 2, a first end C of a laser chip 202 of the laser device 20 is located between a second end D of the heat sink 10 where the laser chip 202 is located and a prism 203 corresponding to the laser chip 202, and a length d by which the first end C extends beyond the second end D of the heat sink 10 is less than or equal to 15 μm. For example, the length d is 10 μm or 9 μm. For example, the length d may also be less than or equal to 5 μm. For example, the length d is 4 μm or 3 μm. The first end C is an end of the laser chip 202 proximate to the prism 203, and the second end D is an end of the heat sink 10 proximate to the prism 203.

Figure 3:
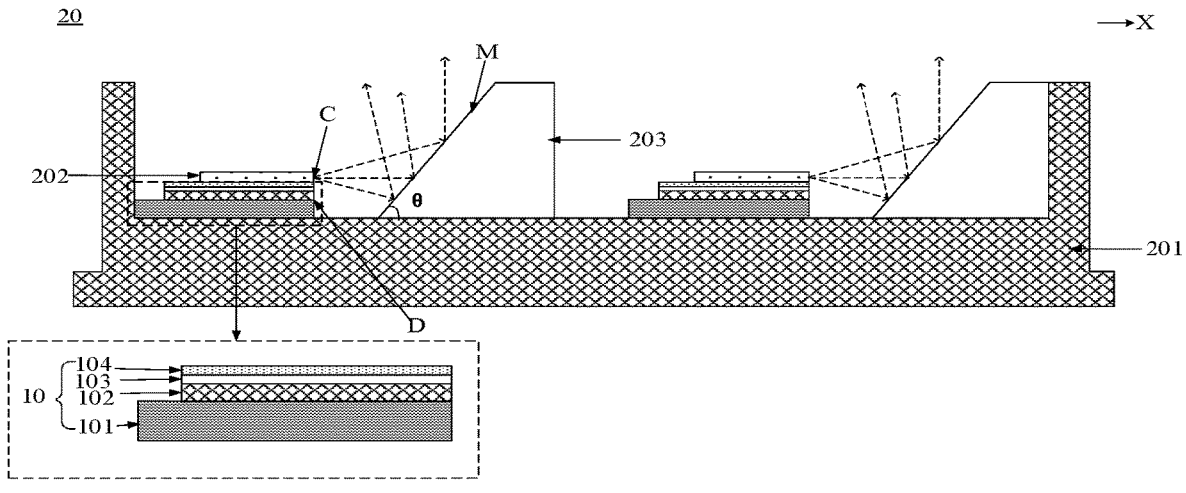
FIG. 3 is a cross-sectional diagram of another laser device, in accordance with some embodiments.

FIG. 3 is a cross-sectional diagram of yet another laser device, in accordance with some embodiments. In some embodiments, as shown in FIG. 3, the first end C of any laser chip 202 of the laser device 20 is flush with the second end D of the heat sink 10 where the laser chip 202 is located.

It will be noted that, the beam of light emitted by the laser chip 202 travels toward the corresponding prism 203, and then is reflected by the reflective surface M of the prism 203 and travels in a direction moving away from the case 201, so as to realize light emission of the laser device 20. Since the beam of light emitted by the laser chip 202 has a divergence angle, the light may reach a surface of the case 201. In order to prevent the beam of light emitted by the laser chip 202 from reaching the case 201, and avoid a waste of light and a decrease in a light-emitting brightness of the laser device 20, it is arranged that the laser chip 202 extends beyond the heat sink 10. That is, it is arranged that the first end C of the laser chip 202 is located between the second end D of the heat sink 10 where the laser chip 202 is located and the prism 203 corresponding to the laser chip 202.

However, in some practices, usually the length d by which the first end C extends beyond the second end D is greater than 15 μm. With this arrangement, more of the light emitted by the laser chip 202 will travel toward a middle portion of the corresponding prism 203, which improves the light-emitting brightness of the laser device 20. However, a portion of the laser chip 202 that extends beyond the heat sink 10 cannot be attached to the heat sink 10. Therefore, when the laser chip 202 emits light, the heat generated by the portion that is not attached to the heat sink 10 cannot be conducted through the heat sink 10, resulting in a slow heat dissipation rate of this portion and a poor heat dissipation effect of the laser chip 202.

In some embodiments, the thickness of the heat sink 10 is large. In a case where the length d by which the first end C of the laser chip 202 extends beyond the second end D of the heat sink 10 where the laser chip 202 is located is small, or even that the first end C is flush with the second end D, it may be possible to prevent the beam of light emitted by the laser chip 202 from travelling toward the case 201 and avoid a waste of light. As a result, a brightness of the beam of light emitted by the laser device 20 may be improved.

In addition, the length d by which the first end C of the laser chip 202 extends beyond the second end D of the heat sink 10 where the laser chip 202 is located is small, or even that the first end C is flush with the second end D. With this arrangement, a contact area between the laser chip 202 and the heat sink 10 may be increased, more areas of the laser chip 202 may be supported, and the stability of the laser chip 202 may be improved. In a case where the first end C is flush with the second end D, the heat generated in each region of the laser chip 202 may be conducted through the heat sink 10, which improves the heat dissipation effect of the laser chip 202.

In some embodiments, an area of an orthogonal projection of the heat sink 10 on the case 201 is set to be greater than an area of an orthogonal projection of the laser chip 202 on the case 201, so as to ensure that each position of the laser chip 202 is supported by the heat sink 10. In this way, it may not only be possible to improve a firmness of the laser chip 202, but it may also be possible to facilitate a dissipation of the heat generated by the laser chip 202. It will be noted that, the area of the orthogonal projection of the heat sink 10 on the case 201 refers to an area of an orthogonal projection of the entire heat sink 10 on the case 201.

The prism 203 provided in some embodiments of the present disclosure will be described below.

As shown in FIG. 2 or 3, in some embodiments, the prism 203 has a reflective surface M that faces the laser chip 202 corresponding to the prism 203, and the prism 203 reflects the beam of light emitted by the corresponding laser chip 202 through the reflective surface M. The reflective surface M is inclined in a direction moving away from the laser chip 202 corresponding to the prism 203 (the X direction in FIG. 2 or 3). That is, a bottom surface of the prism 203 proximate to the case 201 is closer to the laser chip 202 than a top surface of the prism 203 away from the case 201. FIGS. 2 and 3 illustrate a case where the reflective surface M is an inclined surface. An angle θ between the inclined surface and a surface of the case 201 may be 45 degrees.

For example, the reflective surface M may be a concave curved surface. In a case where the reflective surface M is a concave curved surface, the concave curved surface may be an aspherical surface, so that a curvature at each position of the concave curved surface is different. In this case, the beam of light emitted by the laser chip 202 reaching the concave curved surface may be converged into a relatively collimated beam of light and then be emitted. In this case, the use of the collimating lens assembly 209 may be omitted in the laser device 20, which facilitates a miniaturized design of the laser device 20.

Figure 4:
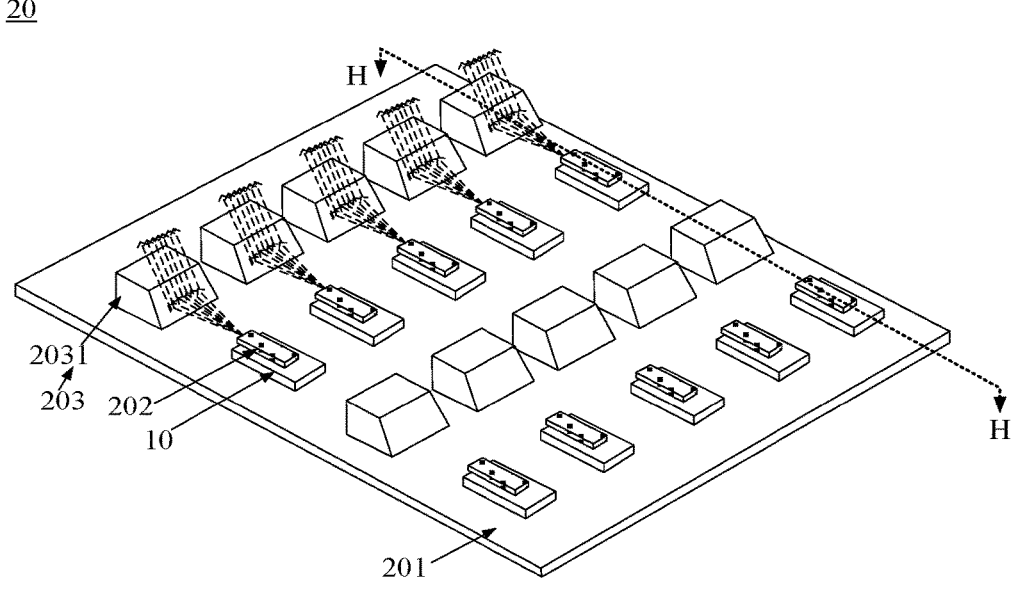
FIG. 4 is a structural diagram of a laser device, in accordance with some embodiments.
Figure 5A:
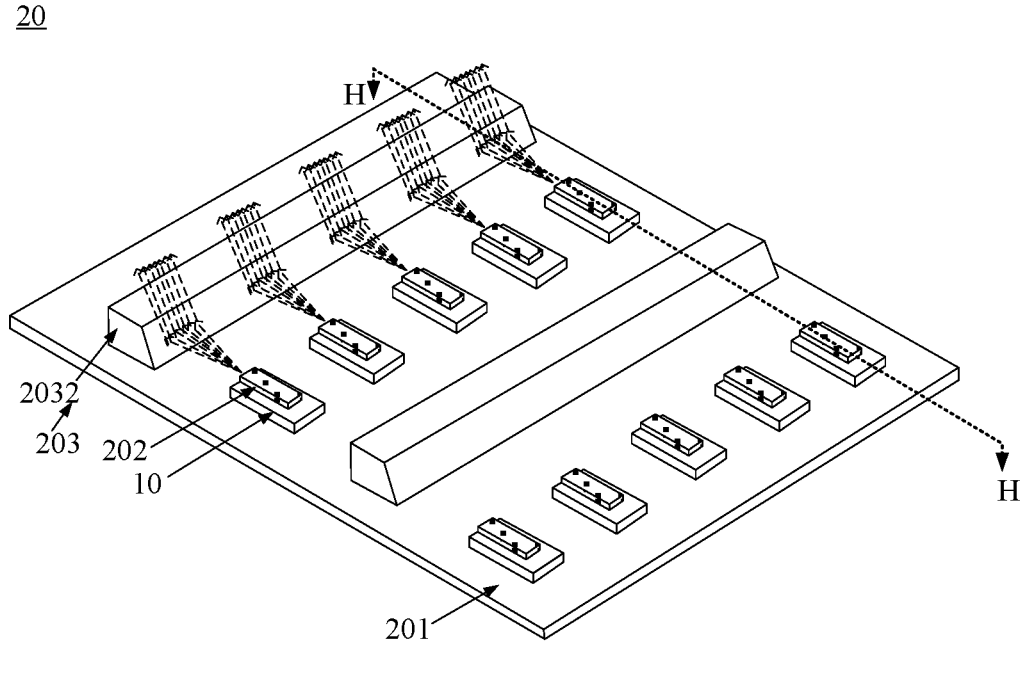
FIG. 5A is a structural diagram of another laser device, in accordance with some embodiments.
Figure 5B:
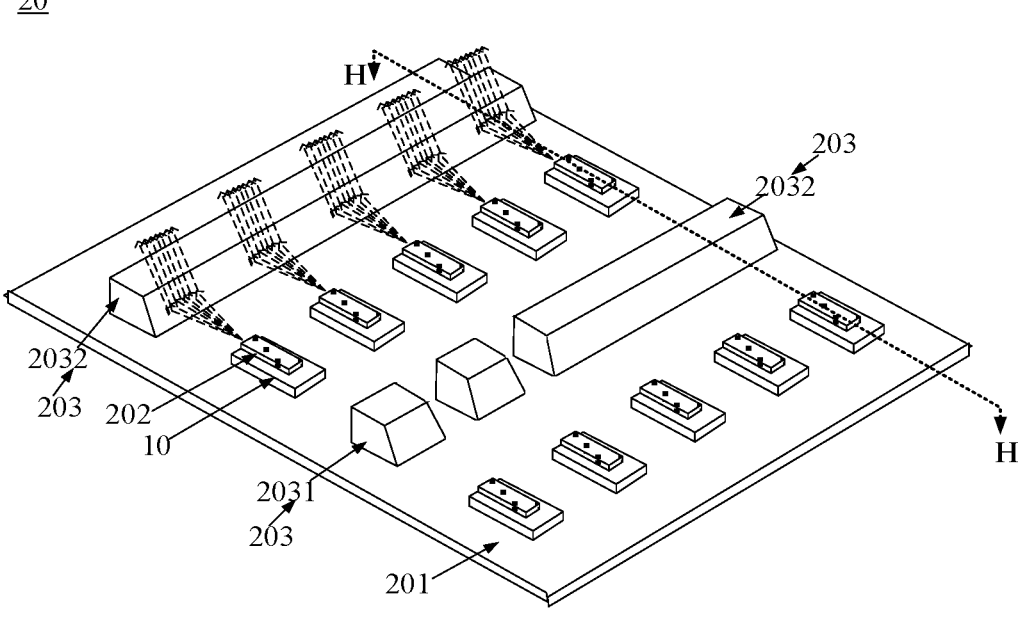
FIG. 5B is a structural diagram of yet another laser device, in accordance with some embodiments.

FIG. 4 is a structural diagram of a laser device, in accordance with some embodiments, and FIG. 2 may be regarded as a cross-sectional diagram taken along line H-H in FIG. 4. FIG. 5A is a structural diagram of another laser device, in accordance with some embodiments, FIG. 5B is a structural diagram of yet another laser device, in accordance with some embodiments, and FIG. 3 may be regarded as a cross-sectional diagram taken along the line H-H in FIG. 5A or FIG. 5B. The at least one heat sink 10 in the laser device 20 corresponds to the at least one prism 203, and each heat sink 10 and the corresponding prism 203 correspond to a same laser chip 202. The prism 203 reflects the beam of light emitted by one or more laser chips 202 disposed on the corresponding heat sink 10. The prisms 203 and the laser chips 202 located on the corresponding heat sinks 10 have two corresponding relations in terms of quantity.

As shown in FIG. 4, in a first corresponding relation, each prism 203 of the at least one prism 203 of the laser device 20 corresponds to a single laser chip 202, and is configured to only reflect the beam of light emitted by a single laser chip 202. The laser device 20 shown in FIG. 4 includes ten laser chips 202 and ten prisms 203 in total. For each prism 203, there is a single laser chip 202 corresponding to the prism 203, and the prism 203 reflects the beam of light emitted by the single laser chip 202. The embodiments of the present disclosure do not limit the specific number of the laser chips 202 and the specific number of the prisms 203.

It will be noted that, FIG. 4 illustrate a case where the first end C of the laser chip 202 extends beyond the second end D of the heat sink 10 where the laser chip 202 is located, and FIG. 4 only illustrates a position of the heat sink 10, and does not show a specific structure of the heat sink 10. It will be understood that, the first end C of the laser chip 202 shown in FIG. 4 may also be flush with the second end D of the heat sink 10 where the laser chip 202 is located, which is not illustrated in the embodiments of the present disclosure.

In some embodiments, the prism 203 in the first corresponding relation may be referred to as a first prism 2031.

As shown in FIG. 5A, in the second corresponding relation, the at least one prism 203 of the laser device 20 includes: a single prism 203 corresponding to the plurality of laser chips 202; and the single prism 203 is configured to reflect beams of light emitted by the plurality of laser chips 202. The laser device 20 shown in FIG. 5A includes ten laser chips 202 and two prisms 203 in total. For each prism 203, there are five laser chips 202 corresponding to the prism 203, and the prism 203 reflects beams of light emitted by the five laser chips 202. The embodiments of the present disclosure do not limit the specific number of the laser chips 202 and the specific number of the prisms 203.

In some embodiments, the prism 203 in the second corresponding relation may be referred to as a second prism 2032.

In some embodiments, the second prism 2032 is in a shape of a strip. A length direction of the second prism 2032 is parallel to a direction in which the plurality of laser chips 202 are arranged, and is perpendicular to a light-emitting direction in which the beam of light is emitted by each laser chip 202 (e.g., the X direction shown in FIGS. 2 and 3).

It will be noted that, FIG. 5A illustrates a case where the first end C of the laser chip 202 is flush with the second end D of the heat sink 10 where the laser chip 202 is located, and FIG. 5A only illustrates the position of the heat sink 10, and does not show the specific structure of the heat sink 10. The first end C of the laser chip 202 shown in FIG. 5A may also extend beyond the second end D of the heat sink 10 where the laser chip 202 is located, which is not illustrated in the embodiments of the present disclosure.

In some other embodiments, as shown in FIG. 5B, the prism 203 includes at least one first prism 2031 and at least one second prism 2032. Each first prism 2031 corresponds to a single laser chip 202, while each second prism 2032 corresponds to a plurality of laser chips 202.

It will be noted that, a structure of the encapsulation portion 2012 is omitted in FIGS. 4, 5A and 5B in order not to block the components in the inner chamber of the encapsulation portion 2012 of the case 201. That is, the cross-sectional diagram shown in FIG. 2 may only be regarded as a cross-sectional diagram taken along the line H-H in FIG. 4, and cannot completely correspond to FIG. 4; the cross-sectional diagram shown in FIG. 3 may only be regarded as a cross-sectional diagram taken along the line H-H in FIG. 5A or 5B, and cannot completely correspond to FIG. 5A or 5B.

Figure 6:
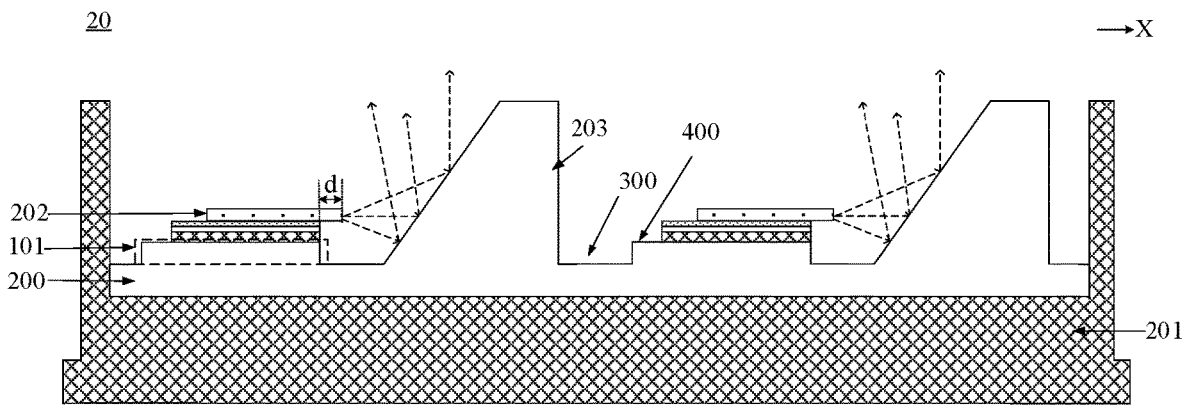
FIG. 6 is a cross-sectional diagram of yet another laser device, in accordance with some embodiments.

FIG. 6 is a cross-sectional diagram of yet another laser device, in accordance with some embodiments. It will be noted that, FIG. 6 illustrates a case where the heat sink 10 is disposed on the support substrate 200, and the heat dissipation substrate 101 of the heat sink 10 is integrally formed with the support substrate 200. FIG. 6 illustrates a case where the first end C of the laser chip 202 extends beyond the second end D of the heat sink 10 where the laser chip 202 is located.

As shown in FIG. 6, the support substrate 200 has a recessed region 300; the at least one prism 203 is located in the recessed region 300, and a raised region 400 that is raised relative to the recessed region 300 in the support substrate 200 is provided with the heat sink 10. In a case where the heat dissipation substrate 101 of the heat sink 10 is integrally formed with the support substrate 200, the raised region 400 may also be regarded as the heat dissipation substrate 101 of the heat sink 10. In this way, it may be possible to avoid a bonding error caused by bonding the heat dissipation substrate 101, reduce an overall manufacturing error of the laser device 20, and improve a collimation degree of the beam of light emitted by the laser device 20.

In some embodiments, as shown in FIG. 6, the prism 203 of the laser device 20 is also integrally formed with the support substrate 200. Therefore, there is no need to bond the prism 203 to the support substrate 200, which may avoid the bonding error caused by bonding the prism 203, further reduce the overall manufacturing error of the laser device 20, and improve the collimation degree of the beam of light emitted by the laser device 20.

In some embodiments, the support substrate 200 is made of a transparent material, and a thickness of the support substrate 200 ranges from 4 mm to 7 mm.

Figure 7:
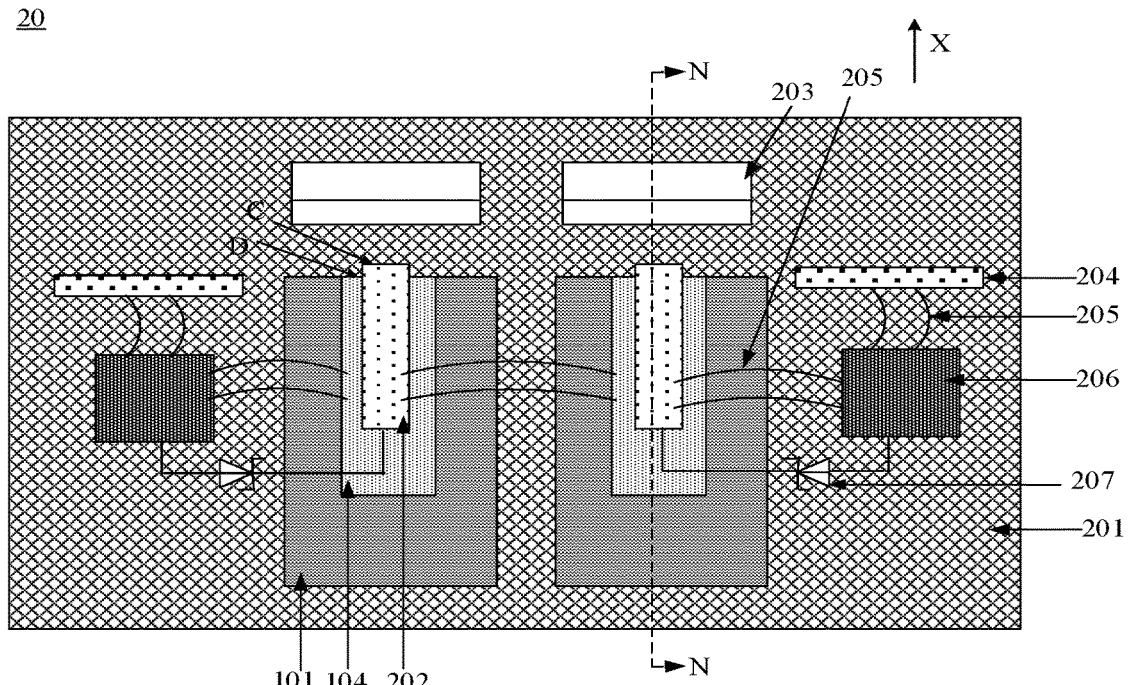
FIG. 7 is a top view of a laser device, in accordance with some embodiments.

FIG. 7 is a top view of a laser device, in accordance with some embodiments. It will be noted that, FIG. 7 illustrates a case where the first end C of the laser chip 202 extends beyond the second end D of the heat sink 10 where the laser chip 202 is located. FIG. 2 may also be regarded as a cross-sectional diagram taken along line N-N in the laser device 20 shown in FIG. 7. FIG. 7 only illustrates a case where the laser device 20 includes two laser chips 202, and each laser chip 202 corresponds to a single prism 203.

In some embodiments, as shown in FIG. 7, the laser device 20 further includes a terminal 204, a wire 205 and a connection pad 206 located inside the case 201. The terminal 204 is electrically connected to an external power source; the terminal 204 is electrically connected to the connection pad 206 through the wire 205, and the connection pad 206 is electrically connected to the electrode of the laser chip 202 through the wire 205.

It will be noted that, if the terminal 204 and the laser chip 202 are directly connected through the wire 205, the wire 205 has to be very long. By providing a connection pad 206 between the terminal 204 and the laser chip 202, it may be possible to realize a transfer of the wire 205, prevent a length of a laid wire 205 from being too long such that the wire 205 breaks, and thus improve a reliability of a connection through the wire 205. For example, the wire 205 is a gold wire.

In some embodiments, a Zener diode is further connected in series between the laser chip 202 and the external power source as a protection resistor 207. For example, the Zener diode 207 may be located between the laser chip 202 and the connection pad 206. That is, the laser chip 202, the Zener diode 207 and the connection pad 206 are connected in sequence through the wire 205. The Zener diode 207 may prevent a current from passing in a case where an input current is larger than a current threshold, thereby protecting the laser chip 202 and preventing the laser chip 202 from being damaged by an excessive current.

In summary, in the laser device 20 provided in some embodiments of the present disclosure, the thermal conductivity of the heat dissipation layer 102 of the heat sink 10 is large, and therefore the heat sink 10 has a good heat dissipation effect. The laser chip 202 is located on the corresponding heat sink 10, and the heat generated by the laser chip 202 when emitting light may be rapidly transferred out by the heat sink 10. As a result, it may be possible to rapidly lower a temperature of the laser chip 202, prevent the laser chip 202 from being damaged due to accumulation of heat, and prolong the service life of the laser device 20.

Finally, it will be noted that, the above embodiments are only used to illustrate the technical solutions of the present disclosure, but not to limit the same. Although the present disclosure are described in detail with reference to the foregoing embodiments, a person of ordinary skill in the art will understand that the technical solutions described in the foregoing embodiments may still be modified, or some of the technical features may be equivalently replaced, and these modifications or replacements do not deviate essences of corresponding technical solutions from the spirit and scope of the technical solutions of the embodiments of the present disclosure.

What is claimed is:

1. A laser device, comprising:

a case;

at least one heat sink located in the case, each heat sink including a heat dissipation substrate, a heat dissipation layer, an auxiliary layer and a conductive layer that are disposed in sequence along a direction away from the case;

a plurality of laser chips located on a side of the at least one heat sink away from the case, each heat sink corresponding to one or more laser chips; and at least one prism located in the case, the at least one heat sink corresponding to the at least one prism, each prism corresponding to one or more laser chips, each prism being located on a light-emitting side of corresponding one or more laser chips, and each prism being configured to reflect a beam of light emitted by the corresponding one or more laser chips;

wherein at least one laser chip among the plurality of laser chips includes a first end that extends beyond a second end of the heat sink where the at least one laser chip is located, wherein the first end is an end of the at least one laser chip proximate to a prism corresponding to the at least one laser chip, and the second end is an end of the heat sink where the at least one laser chip is located proximate to the prism corresponding to the at least one laser chip; and a length by which the first end the at least one laser chip extends beyond the second end of the heat sink where the laser chip is located is less than or equal to 15 m; and wherein in the heat sink where the at least one laser chip is located, ends of the heat dissipation layer, the auxiliary layer and the conductive layer that are away from the prism corresponding to the at least one laser chip, are flush with each other and an end of the heat dissipation substrate away from the prism corresponding to the at least one laser chip, extends beyond the ends of the heat dissipation layer, the auxiliary layer and the conductive layer that are away from the prism corresponding to the at least one laser chip.

2. The laser device according to claim 1, wherein each prism corresponds to one heat sink, and each prism corresponds to the one or more laser chips located on a corresponding heat sink.

3. The laser device according to claim 1, wherein each prism corresponds to two or more of heat sinks, and each prism corresponds to the two or more of laser chips located on the corresponding plurality of heat sinks.

4. The laser device according to claim 3, wherein the prism is in a shape of a strip; and a length direction of the prism is parallel to a direction in which the plurality of laser chips are arranged, and is perpendicular to a direction in which the beam of light is emitted by each laser chip.

5. The laser device according to claim 1, wherein a thermal conductivity of the heat dissipation layer is greater than 20 W/(m·° C.).

6. The laser device according to claim 5, wherein an absolute value of a difference between a thermal expansion coefficient of the heat dissipation substrate and a thermal expansion coefficient of the heat dissipation layer is less than or equal to $30 \times 10^{-6}$/° C.

7. The laser device according to claim 6, wherein a thickness of the heat dissipation layer ranges from 30 μm to 75 μm.

8. The laser device according to claim 6, wherein a material of the heat dissipation layer includes one or more of copper, silver and aluminum.

9. The laser device according to claim 8, wherein a material of the auxiliary layer is different from the material of the heat dissipation layer, and is also different from a material of the conductive layer.

10. The laser device according to claim 9, wherein the material of the auxiliary layer includes nickel.

11. The laser device according to claim 6, wherein a thickness of the conductive layer is greater than or equal to 0.1 μm.

12. The laser device according to claim 1, wherein each heat sink further includes:

an isolation layer located on a side of the conductive layer away from the case; and a solder layer located on a side of the isolation layer away from the case, the solder layer being configured to be soldered to the laser chip and be isolated from the conductive layer by the isolation layer.

13. The laser device according to claim 12, wherein a material of the conductive layer includes gold, a material of the isolation layer includes platinum, and a material of the solder layer includes gold-tin alloy.

14. The laser device according to claim 1, further comprising a support substrate located in the case, wherein the at least one heat sink and the at least one prism are located on a side of the support substrate away from the case.

15. The laser device according to claim 14, further comprising: a frame, a cover plate and a collimating lens assembly that are disposed on a side of the plurality of laser chips away from the case in sequence along a direction away from the case; wherein the frame covers the case, and the frame has an opening, so that the plurality of laser chips and the at least one prism are exposed from the opening;

the cover plate covers the frame to close the opening;

the collimating lens assembly covers the cover plate; the collimating lens assembly includes a plurality of collimating lenses; and the plurality of collimating lenses are in one-to-one correspondence with the plurality of laser chips.

16. The laser device according to claim 15, wherein a thermal expansion coefficient of one or more of the frame, the cover plate and the collimating lens assembly is same as a thermal expansion coefficient of the support substrate;

and/or, a material of one or more of the frame, the cover plate and the collimating lens assembly is same as a material of the support substrate.

17. The laser device according to claim 14, wherein the case includes a base and an encapsulation portion disposed on the base; the encapsulation portion includes a hollow inner chamber; and the support substrate, the plurality of laser chips and the at least one prism are all disposed in the inner chamber.

* * * * *